(12) United States Patent
Haratipour et al.

(10) Patent No.: US 11,980,037 B2
(45) Date of Patent: May 7, 2024

(54) MEMORY CELLS WITH FERROELECTRIC CAPACITORS SEPARATE FROM TRANSISTOR GATE STACKS

(71) Applicant: Intel Corporation, Santa Clara, CA (US)

(72) Inventors: Nazila Haratipour, Portland, OR (US); Shriram Shivaraman, Hillsboro, OR (US); Sou-Chi Chang, Portland, OR (US); Jack T. Kavalieros, Portland, OR (US); Uygar E. Avci, Portland, OR (US); Chia-Ching Lin, Portland, OR (US); Seung Hoon Sung, Portland, OR (US); Ashish Verma Penumatcha, Beaverton, OR (US); Ian A. Young, Portland, OR (US); Devin R. Merrill, McMinnville, OR (US); Matthew V. Metz, Portland, OR (US); I-Cheng Tung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 790 days.

(21) Appl. No.: 16/906,217

(22) Filed: Jun. 19, 2020

(65) Prior Publication Data
US 2021/0398993 A1 Dec. 23, 2021

(51) Int. Cl.
*H10B 53/30* (2023.01)
*H01L 21/768* (2006.01)
*H01L 23/522* (2006.01)

(52) U.S. Cl.
CPC .......... *H10B 53/30* (2023.02); *H01L 21/7687* (2013.01); *H01L 23/5226* (2013.01); *H01L 21/76843* (2013.01)

(58) Field of Classification Search
CPC ................ H10B 53/30; H01L 21/7687; H01L 21/76843; H01L 23/5226
(Continued)

(56) References Cited

U.S. PATENT DOCUMENTS

| 5,192,704 A | 3/1993 | McDavid et al. |
| 5,218,568 A | 6/1993 | Lin et al. |

(Continued)

FOREIGN PATENT DOCUMENTS

| CN | 104425576 A | 3/2015 |
| CN | 108110007 A | 6/2018 |

(Continued)

OTHER PUBLICATIONS

European Extended Search Report dated Feb. 12, 2020 in EP Application No. 19182447.3, 11 pages.
(Continued)

*Primary Examiner* — Tu-Tu V Ho
(74) *Attorney, Agent, or Firm* — Akona IP PC

(57) ABSTRACT

Described herein are ferroelectric (FE) memory cells that include transistors having gate stacks separate from FE capacitors of these cells. An example memory cell may be implemented as an IC device that includes a support structure (e.g., a substrate) and a transistor provided over the support structure and including a gate stack. The IC device also includes a FE capacitor having a first capacitor electrode, a second capacitor electrode, and a capacitor insulator of a FE material between the first capacitor electrode and the second capacitor electrode, where the FE capacitor is separate from the gate stack (i.e., is not integrated within the gate stack and does not have any layers that are part of the gate stack). The IC device further includes an interconnect structure, configured to electrically couple the gate stack and the first capacitor electrode.

20 Claims, 11 Drawing Sheets

(58) Field of Classification Search
USPC .......................................................... 257/295
See application file for complete search history.

(56) References Cited

U.S. PATENT DOCUMENTS

| | | | |
|---|---|---|---|
| 5,412,596 | A | 5/1995 | Hoshiba |
| 5,515,311 | A | 5/1996 | Mihara |
| 5,523,964 | A | 6/1996 | McMillan et al. |
| 6,140,672 | A | 10/2000 | Arita et al. |
| 6,438,021 | B2 | 8/2002 | Kato |
| 6,455,883 | B2 | 9/2002 | Kato et al. |
| 6,642,563 | B2 | 11/2003 | Kanaya |
| 6,809,951 | B2 | 10/2004 | Yamaguchi |
| 7,187,575 | B2 | 3/2007 | Kijima et al. |
| 7,514,734 | B2 | 4/2009 | Aggarwal et al. |
| 7,812,384 | B2 | 10/2010 | Ozaki |
| 9,679,893 | B2 | 6/2017 | Yan et al. |
| 10,128,327 | B2 | 11/2018 | Zhang |
| 2002/0006052 | A1 | 1/2002 | Kato et al. |
| 2002/0038402 | A1 | 3/2002 | Kanaya |
| 2002/0043676 | A1 | 4/2002 | Ohtsuka et al. |
| 2003/0235067 | A1* | 12/2003 | Sakai .................. G11C 11/22 365/145 |
| 2005/0094457 | A1 | 5/2005 | Chen et al. |
| 2006/0268597 | A1 | 11/2006 | Sakuma |
| 2006/0284224 | A1 | 12/2006 | Shuto |
| 2008/0048226 | A1 | 2/2008 | Heo et al. |
| 2008/0121956 | A1 | 5/2008 | Kanaya |
| 2008/0142915 | A1 | 6/2008 | Sashida |
| 2008/0303119 | A1 | 12/2008 | Watanabe |
| 2009/0278120 | A1 | 11/2009 | Lee et al. |
| 2010/0039850 | A1 | 2/2010 | Kitazaki |
| 2010/0321975 | A1 | 12/2010 | Kimura et al. |
| 2012/0314476 | A1 | 12/2012 | Appenzeller et al. |
| 2013/0075717 | A1 | 3/2013 | Tsang |
| 2013/0200361 | A1 | 8/2013 | Tsang |
| 2015/0060957 | A1 | 3/2015 | Lee et al. |
| 2015/0171225 | A1 | 6/2015 | Shi et al. |
| 2016/0027490 | A1 | 1/2016 | Müller |
| 2017/0103988 | A1 | 4/2017 | Nishida et al. |
| 2017/0162702 | A1 | 6/2017 | Hu et al. |
| 2018/0102374 | A1 | 4/2018 | Chavan et al. |
| 2019/0130956 | A1* | 5/2019 | Müller ............... H01L 29/0673 |
| 2019/0189357 | A1 | 6/2019 | Chavan et al. |
| 2020/0075609 | A1 | 3/2020 | Morris et al. |
| 2020/0091162 | A1 | 3/2020 | Morris et al. |
| 2020/0194443 | A1 | 6/2020 | Lin et al. |
| 2020/0273867 | A1 | 8/2020 | Manipatruni et al. |
| 2021/0043557 | A1* | 2/2021 | Lee ....................... H01L 23/481 |
| 2021/0398991 | A1 | 12/2021 | Manfrini et al. |

FOREIGN PATENT DOCUMENTS

| | | |
|---|---|---|
| CN | 109148454 A | 1/2019 |
| CN | 109542839 A | 3/2019 |
| EP | 1265254 A2 | 12/2002 |
| JP | 2001110996 A | 4/2001 |
| JP | 2008153479 A | 7/2008 |
| JP | 4523115 B2 | 8/2010 |
| JP | 3169406 U | 7/2011 |
| WO | 2017171739 A1 | 10/2017 |
| WO | 2018111215 A1 | 6/2018 |
| WO | 2018125024 A1 | 7/2018 |
| WO | 2018231210 A1 | 12/2018 |

OTHER PUBLICATIONS

European Partial Search Report issued in European Application No. 19182447.3 dated Nov. 6, 2019; 13 pages.
International Search Report and Written Opinion for PCT Application No. PCT/US2016/024828 dated Dec. 26, 2016, 11 pages.
Muller, J., et al., "Ferroelectricity in YTTRIUM-Doped Hafnium Oxide," Journal of Applied Physics; vol. 110, No. 11; Dec. 1, 2011 (5 pages).
PCT Application No. PCT/US2017/056296, filed Oct. 12, 2017, "Recessed Thin-Channel Thin-Film Transistor," 46 pages.
PCT Application No. PCT/US2018/023757, filed Mar. 22, 2018, "Thin Film Transistors Having Double Gates," 40 pages.
Sallese, et al., "Principles of the 1-T DRAM Concept on SOI," LEG Laboratory, Swiss Federal Institute of Technology, EPFL, 1015 Lausanne, Switzerland; 19 pages.
U.S. Appl. No. 15/938,153, filed Mar. 28, 2018, "Dual Gate Control for Trench Shaped Thin Film Transistors," 60 pages.
U.S. Appl. No. 15/942,169, filed Mar. 30, 2018, "Top-Gate Doped Thin Film Transistor," 55 pages.
European Partial Search Report issued in EP Application No. 19 183 484.5 dated Jan. 14, 2020; 32 pages.
USPTO Non-Final Office Action issued in U.S. Appl. No. 16/114,272 dated Jan. 26, 2022; 28 pages.
EPO Jun. 23, 2020—Extended European Search Report from European Application No. 19183484.5; 10 pages.

* cited by examiner

MEMORY CELLS WITH FERROELECTRIC CAPACITORS SEPARATE FROM TRANSISTOR GATE STACKS

BACKGROUND

Embedded memory is important for future generation microprocessors and system-on-a-chip (SoC) technology. Thin-film ferroelectric (FE) materials pave the way for a promising technology that can enable viable embedded memory solutions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
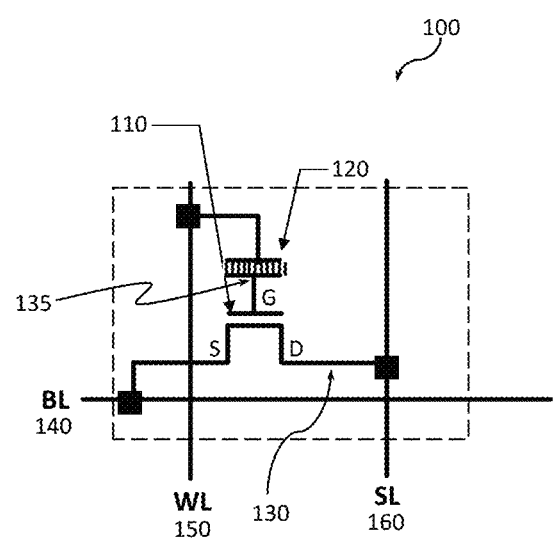
FIG. 1 is an electric circuit diagram of a memory cell having a transistor and a FE capacitor, according to some embodiments of the present disclosure.

Described herein are FE memory cells and corresponding methods and devices. FE memory refers to a memory technology employing FE materials. A FE material is a material that exhibits, over some range of temperatures, a spontaneous electric polarization, i.e., displacement of positive and negative charges from their original position, where a given polarization can be reversed or reoriented by application of an electric field. Because the displacement of the charges in FE materials can be maintained for some time even in the absence of an electric field, such materials may be used to implement memory cells. The term "ferroelectric" is said to be adopted to convey the similarity of FE memories to ferromagnetic memories, despite the fact that there is typically no iron (Fe) present in FE materials. Furthermore, as used herein, the term "ferroelectric" is used to describe both materials that exhibit ferroelectric behavior as well as materials that exhibit antiferroelectric behavior (with the relation between ferroelectricity and antiferroelectricity being analogous to the relation between ferromagnetism and antiferromagnetism).

FE memories have the potential for adequate non-volatility, short programming time, low power consumption, high endurance, and high-speed writing. In addition, FE memories have the potential to be manufactured using processes compatible with the standard complementary metal-oxide-semiconductor (CMOS) technology. Therefore, over the last few years, these types of memories have emerged as promising candidates for many growing applications, e.g., digital cameras and contactless smart cards.

Commercial viability of a FE memory cell may depend on the number of factors. One factor is cell's performance characteristics. Another factor is the ability to manufacture dense memory arrays using simple, low-cost process additions.

Some state-of-the-art FE memory cells suffer from endurance issues due to including a FE material in a gate stack of a transistor (referred to, in such a configuration, as a "FE transistor"), where the switching voltage requirement of the FE transistor may degrade the dielectric buffer material also included in the gate stack, impacting the transistor reliability. Other state-of-the-art FE memory cells suffer from endurance issues due to charging at the FE-semiconductor interface that may take place when a FE material is provided directly on top of a semiconductor material. Some state-of-the-art FE memory cells involve complex fabrication sequences, increasing fabrication costs and hindering large-scale adoption of the technology. Improvements on one or more of these challenges would be desirable.

FE memory cells disclosed herein include transistors, e.g., metal-oxide-semiconductor field-effect transistors (MOSFETs), having gate stacks separate from FE capacitors of these cells (i.e., the FE capacitors are not integrated with the transistor gates of the transistors included in the memory cells). An example memory cell may be implemented as an IC device that includes a support structure (e.g., a substrate), a field-effect transistor (FET) provided over the support structure and including a gate stack. The IC device also includes a FE capacitor having a first capacitor electrode, a second capacitor electrode, and a capacitor insulator of a FE material between the first capacitor electrode and the second capacitor electrode, where the FE capacitor is separate from the gate stack (i.e., is not integrated within the gate stack and does not have any layers that are part of the gate stack). The IC device further includes an interconnect structure, configured to electrically couple the gate stack and the first capacitor electrode. In some embodiments, the gate stack may include a gate dielectric material provided over at least a portion of a semiconductor material (e.g., the semiconductor material of the support structure, or the semiconductor material provided over the support structure), and a gate electrode material provided over the gate dielectric material. A portion of the semiconductor material over which the gate stack is provided may serve as a channel material (i.e., a material in which, during operation of the transistor, one or more conductive channels may be formed). The term "FE capacitor" arises from the fact that the first and second capacitor electrodes are separated by the FE material. The FE capacitor of such a memory cell may be described as being "separate" from a transistor gate because, unlike memory cell designs where a FE capacitor is integrated with a transistor gate in that a first capacitor electrode is provided over a gate dielectric material and the FE capacitor is provided in place of a typical gate electrode metal of a conventional MOSFET, the FE capacitor of the memory cells described herein is not integrated with the transistor gate and is coupled to the transistor gate by an interconnect structure. The transistor may be used to control both READ and WRITE access to the FE capacitor and may be referred to as an "access transistor."

Various embodiments of FE memory cells described herein may achieve one or more advantages compared to state-of-the-art FE memory cells. One advantage is that separating the FE material from the gate stack of the access transistor may improve transistor reliability by reducing the impact of the switching voltage for the FE material on the dielectric buffer material of the gate stack. Furthermore, separating the FE material of the FE capacitor from the dielectric buffer material of the gate stack of the access transistor may allow separately controlling the dielectric buffer area and thickness in the transistor and the ferroelectric area and thickness in the FE capacitor structure. The gate voltage may then be divided according to the ratio of these two capacitors, i.e., the dielectric capacitor of the gate stack and the FE capacitor coupled thereto. The capacitance of the gate stack may be sufficiently large so that a large portion of voltage across the gate stack may be used for polarization reversal of the FE capacitance. Thus, separating the FE capacitor from the gate stack may allow increasing the dielectric capacitor (i.e., the capacitance of the gate stack) and reduce the FE capacitor to 1) reduce the FE polarization and depolarization fields, and 2) increase the dielectric capacitor area to maximize the voltage across the FE layer of the FE capacitor. Another advantage is that separating the FE material of the FE capacitor from the semiconductor channel material of the access transistor eliminates the FE-semiconductor interface that may cause endurance issues in some state-of-the-art FE memory cells. Yet other advantages may include the ability to fabricate FE memory cells described herein using relatively simple, low-cost fabrication processes, eliminating the need for a large capacitor and a very-low leakage transistor, and so on. Other technical effects will be evident from various embodiments described here.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected or an indirect electrical or magnetic connection through one or more passive or active intermediary devices. The term "circuit" means one or more passive and/or active components that are arranged to cooperate with one another to provide a desired function. The terms "gate stack" and "gate" may be used interchangeably. As used herein, a "logic state" of a FE memory cell refers to one of a finite number of states that the cell can have, e.g., logic states "1" and "0," each state represented by a different polarization of the FE material of the cell. As used herein, a "READ" and "WRITE" memory access or operations refer to, respectively, determining/sensing a logic state of a memory cell and programming/setting a logic state of a memory cell. In various embodiments, the terms "oxide," "carbide," "nitride," etc. refer to compounds containing, respectively, oxygen, carbon, nitrogen, etc., while the term "high-k dielectric" refers to a material having a higher dielectric constant (k) than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer may be in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 8A-8B, such a collection may be referred to herein without the letters, e.g., as "FIG. 8."

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more memory cells having FE capacitors separate from transistor gates as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Memory cells having FE capacitors separate from transistor gates as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Electric Circuit Diagram of a Unit Memory Cell

FIG. 1 is an electric circuit diagram of a memory cell (unit cell) 100 that may be implemented with a FE capacitor being separate from a transistor gate, according to some embodiments of the present disclosure. As shown, the memory cell 100 may include a transistor 110 and a FE capacitor 120.

The transistor 110 has a gate terminal, a source terminal, and a drain terminal, indicated in the example of FIG. 1 as terminals G, S, and D, respectively. As is commonly known, source and drain terminals may be interchangeable in transistors. Therefore, while the example of FIG. 1 illustrates a source terminal on the left side of the drawing and a drain terminal on the right side, in other embodiments, this arrangement may be reversed. Together, source and drain terminals of a transistor may be referred to a "transistor terminal pair," where the individual ones of these two terminals may be referred to as a "first source or drain (S/D) terminal" and a "second S/D terminal" (e.g., when the first S/D terminal is a source terminal, then the second S/D terminal is a drain terminal, and vice versa).

In various embodiments, the transistor 110 may be any metal-oxide-semiconductor (MOS) transistors which include drain, source, and gate terminals. Embodiments of the present disclosure are explained below with reference to FET. The transistor 110 may be either an N-type metal-oxide-semiconductor (NMOS), N-type MOSFET transistor, or a P-type metal-oxide-semiconductor (PMOS), P-type MOSFET transistor. Furthermore, in various embodiments, transistor 110 can have planar or non-planar architecture, as suitable for a particular implementation. Recently, transistors with non-planar architecture, e.g., double-gate transistors, finFETs, nanoribbon transistors, or nanowire transistors have been extensively explored as promising alternatives to transistors with planar architecture. Therefore, embodiments of the present disclosure are explained below and illustrated with reference, but are not limited, to the transistor 110 being a finFET. However, these explanations can be easily extended to embodiments of non-planar transistors having architecture other than finFET, e.g., to nanowire or nanoribbon transistors, as well as to embodiments of transistors having planar architecture, all of which embodiments being, therefore, within the scope of the present disclosure.

A finFET refers to a FET having a non-planar architecture where a fin, formed of one or more semiconductor materials, extends away from a base. FinFETs are sometimes interchangeably referred to as "tri-gate transistors," where the name "tri-gate" originates from the fact that, in use, such a transistor may form conducting channels on three "sides" of the fin. However, in general, a finFET can be such that less than three conducting channels are formed during operation.

In a finFET, sides of a portion of a fin that is closest to a base are enclosed by a dielectric material, typically an oxide, commonly referred to as a "shallow trench isolation" (STI). In a conventional finFET, a gate stack that includes a stack of one or more gate electrode metals and a stack of one or more gate dielectrics is provided over the top and sides of the remaining upper portion of the fin (i.e., the portion that extends above the STI), thus wrapping around the upper portion of the fin and forming a three-sided gate of a finFET. The portion of the fin that is enclosed by the STI is referred to as a "sub-fin" while the portion of the fin over which the gate stack wraps around is referred to as a "channel" or a "channel portion." A semiconductor material of which the channel portion of the fin is formed is commonly referred to as a "semiconductor channel material" or, simply, a "channel material." A source region and a drain region are provided on the opposite ends of the fin, on either side of the gate stack, forming, respectively, a source and a drain of such a transistor.

Figure 2:
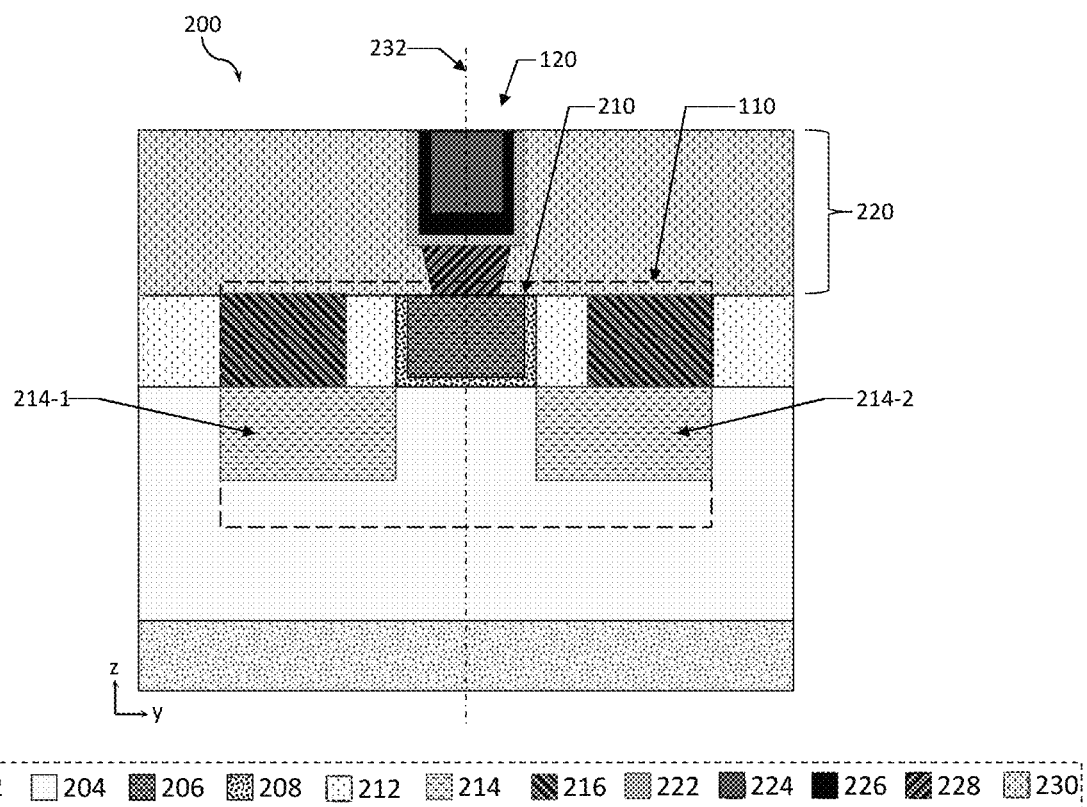
FIG. 2 is a cross-sectional side view of the memory cell of FIG. 1 with the FE capacitor being separate from a gate stack of the transistor, according to some embodiments of the present disclosure.

As shown in FIG. 1, the FE capacitor 120 may be coupled to the gate stack of the transistor 110. The FE capacitor 120 includes first and second capacitor electrodes, separated from one another by a FE material. Thus, instead of a regular dielectric material used in conventional dielectric (i.e., not FE) capacitors, the FE capacitor 120 includes a FE material, separating conductors of the first and second capacitor electrodes. In contrast to some state-of-the-art implementations where the first capacitor electrode could be provided between the one or more gate dielectrics of the gate stack of the transistor 110 and the FE material, while the FE material is provided between the first and second capacitor electrodes, both electrodes and the FE material of the FE capacitor 120 is provided separate from the gate stack of the transistor 110, e.g., as shown in FIG. 2 and described in greater detail below. In this manner, the FE capacitor 120 of the memory cell 100 is not integrated into a transistor gate of the transistor 110, but is separate from the gate. Furthermore, in the memory cell 100, the FE material is separated from the semiconductor channel material of the transistor 110 by at least the bottom capacitor electrode, which may provide an improvement with respect to endurance limitations experienced by some FE memory cells where an FE material is provided directly on the semiconductor channel material.

As shown in FIG. 1, in the memory cell 100, the first capacitor electrode of the FE capacitor 120 may be coupled to the gate terminal of the transistor 110, while the second capacitor electrode may be coupled to a word-line (WL) 150, the first S/D terminal (e.g., a source terminal) of the transistor 110 may be coupled to a bit-line (BL) 140, and the second S/D terminal (e.g., a drain terminal) of the transistor 110 may be coupled to a select-line (SL) 160. As described in greater detail below, together, the WL 150, the BL 140, and the SL 160 may be used to read and program the FE capacitor 120. Each of the WL 150, the BL 140, and the SL 160 may be made of the same or different electrically conductive materials, alloys, or stacks of multiple electrically conductive materials. In some embodiments, various electrically conductive materials that may be used for the WL 150, the BL 140, and the SL 160 may include one or more metals or metal alloys, with metals such as copper, ruthenium, palladium, platinum, cobalt, nickel, hafnium, zirconium, titanium, tantalum, and aluminum. In some embodiments, various electrically conductive materials that may be used for the WL 150, the BL 140, and the SL 160 may include one or more electrically conductive alloys oxides or carbides of one or more metals.

Also shown in FIG. 1 is the storage node (SN), described in greater detail below, which may also be referred to as a floating node (FN) 135, also described in greater detail below, which may include/be the bottom capacitor electrode of the FE capacitor 120, and may also be coupled to the gate of the transistor 110.

Example Layout of a Unit Memory Cell with a FE Capacitor Separate from a Transistor Gate FIG. 2 is a cross-sectional side view (e.g., an y-z plane of a reference coordinate system x-y-z) of an IC device 200 that illustrates one example layout implementation of the memory cell 100 of FIG. 1, with the FE capacitor 120 being separate from a gate stack of the transistor 110 and being implemented in the back end of line (BEOL), according to some embodiments of the present disclosure. The IC device 200 illustrates a memory cell implementing one particular example transistor architecture, namely, finFET architecture, but these descriptions may be extended to other transistor architectures for the transistors 110 of the memory cell 100. A number of elements labeled in FIG. 1 with reference numerals, as well as some further reference numerals of elements are indicated in FIG. 2 with different patterns in order to not clutter the drawing, with a legend showing the correspondence between the reference numerals and patterns being provided at the bottom of FIG. 2. For example, the legend illustrates that FIG. 2 uses different patterns to show the support structure 202, the semiconductor material 204, the gate electrode material 206, etc.

As shown in FIG. 2, the IC device 200 includes a support structure 202, on which a semiconductor material 204 for forming a channel of the transistor 110 is provided.

Implementations of the present disclosure may be formed or carried out on any suitable support structure 202, such as a substrate, a die, a wafer, or a chip. The support structure 202 may, e.g., be the wafer 2000 of FIG. 8A, discussed below, and may be, or be included in, a die, e.g., the singulated die 2002 of FIG. 8B, discussed below. The support structure 202 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 202 may be a printed circuit board (PCB) substrate. Although a few examples of materials from which the support structure 202 may be formed are described here, any material that may serve as a foundation upon which an IC device implementing any of the memory cells as described herein may be built falls within the spirit and scope of the present disclosure.

Although shown in FIG. 2 to be separate from the support structure 202, in some embodiments, the semiconductor material 204 may be a part of the support structure 202. In other embodiments, the semiconductor material 204 may be provided over the support structure 202. In some embodiments, the semiconductor material 204 may be formed as a fin, extending away from the support structure 202. The transistor 110 may be formed on the basis of the semiconductor material 204 by having a gate stack 210 wrap around at least a portion of the semiconductor material 204 referred to as a "channel portion" and by having source and drain regions, shown in FIG. 2 as a first source or drain (S/D) region 214-1 and a second S/D region 214-2 be provided within the semiconductor material 204 on either side of the gate stack 210.

In some embodiments, the channel portion of the semiconductor material 204 may be composed of semiconductor material systems including, for example, N-type or P-type materials systems. In some embodiments, the channel portion of the semiconductor material 204 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel portion of the semiconductor material 204 may include a combination of semiconductor materials. In some embodiments, the channel portion of the semiconductor material 204 may include a monocrystalline semiconductor, such as silicon (Si) or germanium (Ge). In some embodiments, the channel portion of the semiconductor material 204 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an NMOS transistor), the channel portion of the semiconductor material 204 may advantageously include a III-V material having a high electron mobility, such as, but not limited to InGaAs, InP, InSb, and InAs. For some such embodiments, the channel portion of the semiconductor material 204 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the semiconductor material 204 may be an intrinsic III-V material, i.e., a III-V semiconductor material not intentionally doped with any electrically active impurity. In alternate embodiments, a nominal impurity dopant level may be present within the channel portion of the semiconductor material 204, for example to further fine-tune a threshold voltage Vt, or to provide HALO pocket implants, etc. Even for impurity-doped embodiments however, impurity dopant level within the channel portion of the semiconductor material 204 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 110 is a PMOS transistor), the channel portion of the semiconductor material 204 may advantageously be a group IV material having a high hole mobility, such as, but not limited to Ge or a Ge-rich SiGe alloy. For some example embodiments, the channel portion of the semiconductor material 204 may have a Ge content between 0.6 and 0.9, and advantageously may be at least 0.7. In some embodiments with highest mobility, the channel portion of the semiconductor material 204 may be intrinsic III-V (or IV for P-type devices) material and not intentionally doped with any electrically active impurity. In alternate embodiments, one or more a nominal impurity dopant level may be present within the channel portion of the semiconductor material 204, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the channel portion of the semiconductor material 204 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 110 is a thin-film transistor (TFT), the channel portion of the semiconductor material 204 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

The S/D regions 214 of the transistor 110 may generally be formed using either an implantation/diffusion process or an etching/deposition process. In the former process, dopants such as boron, aluminum, antimony, phosphorous, or arsenic may be ion-implanted into the semiconductor material 204 to form the source and drain regions. An annealing process that activates the dopants and causes them to diffuse further into the semiconductor material 204 may follow the ion implantation process. In the latter process, portions of the semiconductor material 204 may first be etched to form recesses at the locations of the future S/D regions 214. An epitaxial deposition process may then be carried out to fill the recesses with material that is used to fabricate the S/D regions 214. In some implementations, the S/D regions 214 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 214 may be formed using one or more alternate semiconductor materials such as germanium or a group III-V material or alloy. And in further embodiments, one or more layers of metal and/or metal alloys may be used to form the S/D regions 214.

Turning to the gate stack 210, in some embodiments, the gate stack 210 may include a gate electrode material 206 and, optionally, a gate dielectric material 208.

The gate electrode material 206 may include at least one P-type work function metal or N-type work function metal, depending on whether the transistor 110 is a PMOS transistor or an NMOS transistor (P-type work function metal used as the gate electrode material 206 when the transistor 110 is a PMOS transistor and N-type work function metal used as the gate electrode material 206 when the transistor 110 is an NMOS transistor). For a PMOS transistor, metals that may be used for the gate electrode material 206 may include, but are not limited to, ruthenium, palladium, platinum, cobalt, nickel, and conductive metal oxides (e.g., ruthenium oxide). For an NMOS transistor, metals that may be used for the gate electrode material 206 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 206 may include a stack of two or more metal layers, where one or more metal layers are work function metal layers and at least one metal layer is a fill metal layer. Further layers may be included next to the gate electrode material 206 for other purposes, such as to act as a diffusion barrier layer or/and an adhesion layer.

In some embodiments, the gate dielectric material 208 may include one or more high-k dielectric materials. For example, in some embodiments, the gate dielectric material 208 may include elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the gate dielectric material 208 may also include one or more low-k dielectric materials. For example, in some embodiments, a thin layer of silicon oxide or silicon oxynitride may be formed below the high-k dielectric of the gate stack. In some embodiments, an annealing process may be carried out on the gate dielectric material 208 during manufacture of the transistor 110 to improve the quality of the gate dielectric material 208. The gate dielectric material 208 may have a thickness that may, in some embodiments, be between about 0.5 nanometers and 3 nanometers, including all values and ranges therein (e.g., between about 1 and 3 nanometers, or between about 1 and 2 nanometers).

In some embodiments, the gate stack 210 may be surrounded by an insulating material 212. The insulating material 212 may be any suitable dielectric material, e.g., any suitable interlayer dielectric (ILD) material, configured to provide separation between the gate stack 210 and S/D contacts 216 of the transistor 110. In some embodiments, the insulating material 212 may include one or more high-k dielectric materials, e.g., any of those described with reference to the materials of the gate dielectric material 208. In other embodiments, the insulating material 212 may include one or more low-k dielectric materials. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. The S/D contacts 216 may include any of the electrically conductive materials described with reference to the WL 150, the BL 140, and the SL 160. In particular, one of the S/D contacts 216 may be implemented as the BL 140 and one of the S/D contacts 216 may be implemented as the SL 160. For example, because, as described above, the first S/D region 214-1 is coupled to the BL 140, the S/D contact 216 shown to the left of the gate stack 210 of the IC device 200 may be a part of the BL 140. In this case, because the second S/D region 214-2 is coupled to the SL 160, the S/D contact 216 shown to the right of the gate stack 210 of the IC device 200 may be a part of the SL 160.

Turning to the FE capacitor 120 of the IC device 200, FIG. 2 illustrates that, in some embodiments, the memory cell 100 may be implemented so that the FE capacitor 120 is provided above the transistor 110, e.g., in the BEOL layer 220. The FE capacitor 120 may include a first capacitor electrode 222, a second capacitor electrode 224, and a capacitor insulator 226 that includes a FE material between the first capacitor electrode 222 and the second capacitor electrode 224. Each of the first and second capacitor electrodes 222, 224 may include any of the electrically conductive materials described with reference to the WL 150, the BL 140, and the SL 160. The FE material employed in the capacitor insulator 226 of the FE capacitor 120 may be one of the novel materials exhibiting ferroelectric or antiferroelectric behavior at thin dimensions, such as hafnium zirconium oxide (HfZrO, also referred to as HZO, which is a material that includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), and a perovskite material (e.g., lead zirconate titanate (PZT), PbTiO3 (PTO), or barium titanate (BTO)). However, in other embodiments, any other materials which exhibit ferroelectric or antiferroelectric behavior at thin dimensions may be used as the capacitor insulator 226 and are within the scope of the present disclosure.

As shown in FIG. 2, the first capacitor electrode 222 may be coupled to the gate stack 210 using an interconnect structure 228. The interconnect structure 228 may include any of the electrically conductive materials described with reference to the WL 150, the BL 140, and the SL 160. In some embodiments, the center axis of the interconnect structure 228 may be substantially aligned with the center axis of the gate stack 210, as shown in FIG. 2, where the dash-dotted line 232 illustrates a center axis. The second capacitor electrode 224 may be coupled to the WL 150, as described above (not specifically shown in FIG. 2).

In some embodiments, the FE capacitor 120 and the interconnect structure 228 may be surrounded by an insulating material 230, which may include any of the materials described with reference to the insulating material 212. When the FE capacitor 120 is provided in the BEOL layer 220, it may be provided in an opening (e.g., a trench opening) in the insulating material 230 of the BEOL layer 220. The first capacitor electrode 222 may then be provided as a liner of a first electrically conductive material on sidewalls and a bottom of the opening in the BEOL layer 220, and then the capacitor insulator 226 may be provided as a liner of the FE material on sidewalls and a bottom of the opening lined with the first electrically conductive material that formed the first capacitor electrode 222. In some embodiments, the layer of the first capacitor electrode 222 may have a thickness between about 5 nanometers and 30 nanometers, including all values and ranges therein (e.g., between about 10 and 28 nanometers, or between about 15 and 25 nanometers). In some embodiments, the layer of the capacitor insulator 226 may have a thickness between about 0.5 nanometers and 20 nanometers, including all values and ranges therein (e.g., between about 1 and 15 nanometers, or between about 0.5 and 5 nanometers). The second capacitor electrode 224 may be provided as a second electrically conductive material filling at least a portion of the opening lined with the first electrically conductive material and with the FE material, as shown in FIG. 2. In such embodiments, the interconnect structure 228 is also in the BEOL layer 220, as shown in FIG. 2. In some embodiments, a center axis of the opening for the FE capacitor 120 may be substantially aligned with the center axis 232 of the gate stack 210 and/or with the center axis of the interconnect structure 228.

FIG. 2 illustrates that the FE capacitor 120 of the IC device 200 is provided in the BEOL layer 220. However, in other embodiments of the IC device 200, the FE capacitor 120 may be provided separate from the gate stack 210 of the transistor 110 by being provided in the front-end of line (FEOL) layer, e.g., in an opening (e.g., a trench opening) in the semiconductor material 204, in an opening (e.g., a trench opening) in the insulating material 212, and/or in an opening (e.g., a trench opening) that extends both through the semiconductor material 204 and the insulating material 212.

Arrays of Unit Cells with FE Capacitors Separate from Transistor Gates

Figure 3:
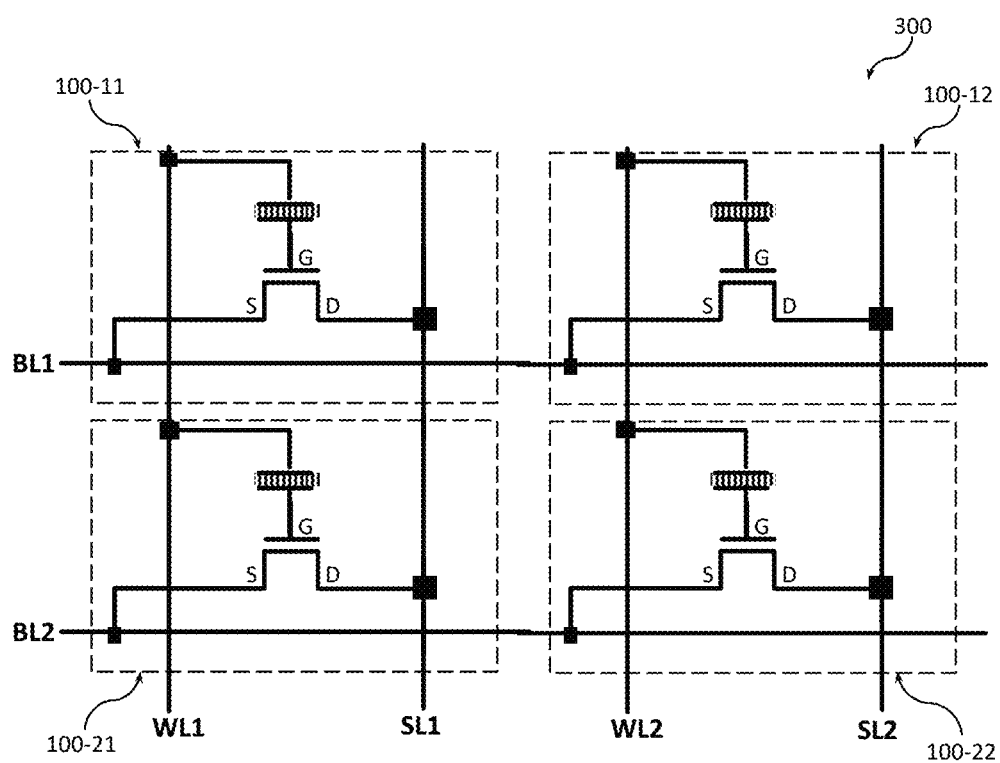
FIG. 3 is an electric circuit diagram of a plurality of memory cells of FIG. 2 arranged in an array, according to some embodiments of the present disclosure.

The memory cell 100 as shown in FIG. 1 (e.g., the layout of the IC device 200 shown in FIG. 2) is a "unit cell," where a plurality of such unit cells may be arranged in an array to implement a memory device. FIG. 3 provides a schematic illustration of a plurality of the memory cells 100, namely four cells, arranged in an array 300, according to some embodiments of the present disclosure. Each memory cell shown in FIG. 3 could be any one of the memory cells having a FE capacitor being separate from a transistor gate as described herein, e.g., any of the embodiments of the memory cell 100 (e.g., any of the embodiments of the implementation shown in FIG. 2). Individual memory cells 100 are illustrated in FIG. 3 to be within one of the dashed boxes labeled 100-11, 100-12, 100-21, and 100-22. While only four memory cells 100 are shown in FIG. 3, in other embodiments, the array 300 may, and typically would, include many more memory cells. Furthermore, in other embodiments, the memory cells 100 may be arranged in arrays in a manner other than what is shown in FIG. 3, e.g., in any suitable manner of arranging memory cells into arrays as known in the art, all of which being within the scope of the present disclosure.

In some embodiments, each of the BL 140, the WL 150, and the SL 160 can be shared among multiple, possibly different subsets of, memory cells 100. FIG. 3 illustrates one such embodiment where, as shown, the BL 140 can be shared among multiple memory cells 100 in a column, and each of the WL 150 and the SL 160 can be shared among multiple memory cells 100 in a row. As is conventionally used in context of memory, the terms "row" and "column" do not reflect the, respectively, horizontal and vertical orientation on a page of a drawing illustrating a memory array but, instead, reflect on how individual memory cells are addressed. Namely, memory cells 100 sharing a single BL are said to be in the same column, while memory cells sharing a single WL are said to be on the same row. Thus, in FIG. 3, the horizontal lines refer to columns while vertical lines refer to rows. Different instances of each line (BL, WL, and FL) are indicated in FIG. 3 with different reference numerals, e.g., BL1 and BL2 are the two different instances of the BL 140 as described herein. The same reference numeral on the different lines WL and SL indicates that those lines are used to address/control the memory cells in a single row, e.g., WL1 and SL1 are used to address/control the memory cells 100 in row 1, and so on. Each memory cell 100 may then be addressed by using the BL corresponding to the column of the cell and by using the WL and SL corresponding to the row of the cell. For example, as shown in FIG. 3, the memory cell 100-11 is controlled by BL1, WL1, and SL1, the memory cell 100-12 is controlled by BL1, WL2, and SL2, and so on.

Figure 4:
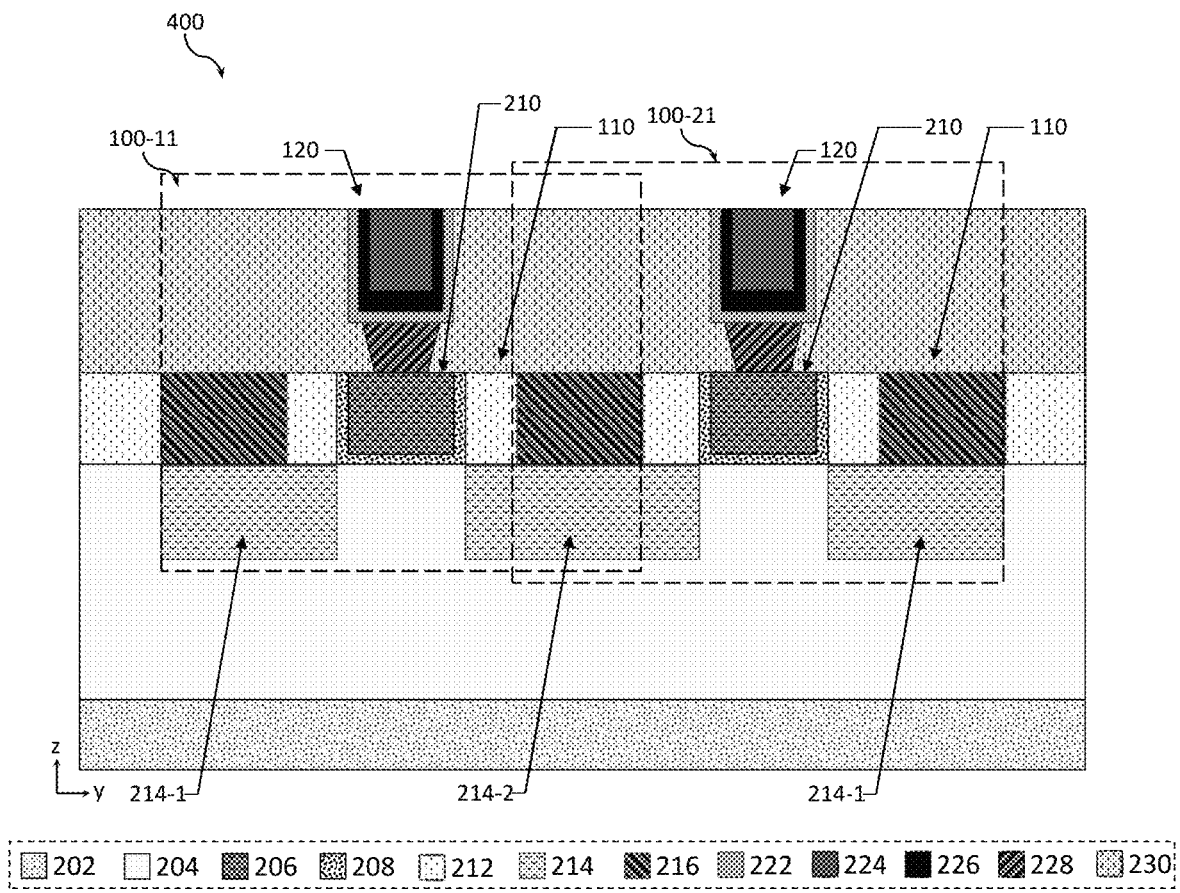
FIG. 4 is a cross-sectional side view of an example integrated circuit (IC) device having two memory cells of the array of FIG. 3, according to some embodiments of the present disclosure.

FIG. 4 is a cross-sectional side view of an example IC device 400 having two memory cells of the array of FIG. 3, in particular the memory cells 100-11 and 100-21, according to some embodiments of the present disclosure. The IC device 400 illustrates a view similar to that shown in FIG. 2, where the same reference numerals refer to the same or analogous elements/materials. Thus, if the semiconductor material 204 is shaped as a fin, then the memory cells 100-11 and 100-21 are provided along a single fin, as shown in FIG. 4.

In the IC device 400, the memory cell 100-11 may be substantially the same as the memory cell shown in FIG. 2, while the memory cell 100-21 may be a mirror image of that memory cell (i.e., for the memory cell 100-21, the S/D region 214 of the transistor 110 that is coupled to the SL 160 is to the left of the gate stack 210 of that transistor, while the S/D region 214 of the transistor 110 that is coupled to the BL 140 is to the right of the gate stack 210 of that transistor. As shown in FIG. 4, in some embodiments, the second S/D region 214-2 of the transistor 110 of the memory cell 100-11 may be shared with the second S/D region 214-2 of the transistor 110 of the memory cell 100-21, and this shared S/D region 214-2 may be coupled to a single SL 140 (the SL1, shown in FIG. 4). Thus, the S/D contact 216 shown in FIG. 4 to be between the gate stacks 210 of the memory cells 100-11 and 100-21 may be a part of the SL 140, e.g., the SL1 of FIG. 4. On the other hand, the S/D contact 216 shown to the left of the gate stack 210 of the memory cell 100-11 may be a part of a first BL 140, e.g., BL1 of FIG. 4, while the S/D contact 216 shown to the right of the gate stack 210 of the memory cell 100-21 may be a part of a second BL 140, e.g., BL2 of FIG. 4. Although not specifically shown in FIG. 5, the second capacitor electrode 224 of the memory cell 100-11 may be coupled to the second capacitor electrode 224 of the memory cell 100-21, e.g., by virtue of both of them being coupled to a single WL, e.g., WL1 of FIG. 4.

Figures 5, 6:
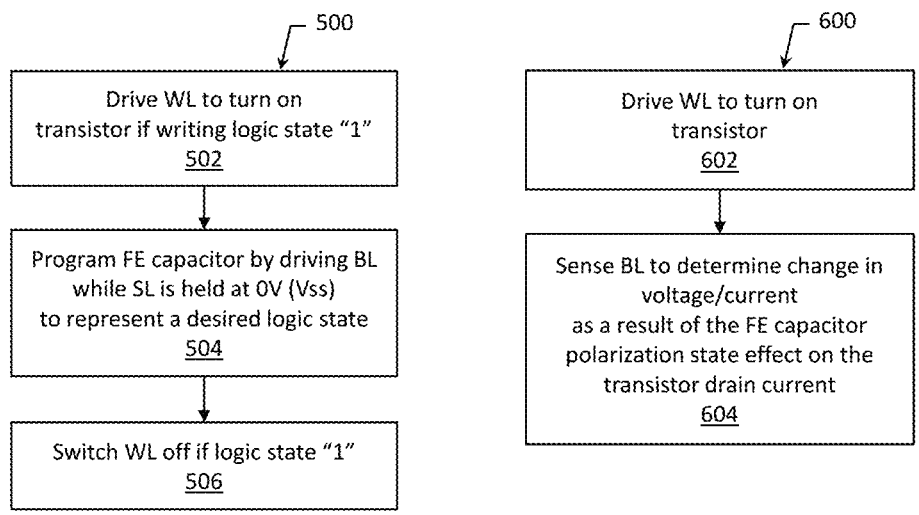
FIG. 5 is a flow diagram of an example method for programming a memory cell having a FE capacitor being separate from a transistor gate, in accordance with various embodiments of the present disclosure.
FIG. 6 is a flow diagram of an example method for reading a memory cell having a FE capacitor being separate from a transistor gate, in accordance with various embodiments of the present disclosure.

Operating a Memory Cell with a FE Capacitor Being Separate from a Transistor Gate Next, methods of operating the memory cell 100 as described herein will be explained, with reference to associated FIGS. In particular, FIGS. 5 and 6 illustrate, respectively, a WRITE operation and a READ operation.

FIG. 5 is a flow diagram of an example method 500 for operating a memory cell having a FE capacitor being separate from a transistor gate, e.g., the memory cell 100, in particular, for programming (i.e., writing to) such a memory cell, in accordance with various embodiments.

At 502 shown in FIG. 5, the WL connected to the memory cell 100 may be asserted to turn on the transistor 110 for writing the logic state "1" to the memory cell 100. To this end, e.g., the WL 150 may transition from logic low to logic high to turn on the transistor 110, e.g., by applying voltage (e.g., WL=Vdd) sufficient to turn on the transistor 110, e.g., 1.0 Volts (V). For writing the logic state "0" to the memory cell, the transistor 110 is not turned on (i.e., WL=0 Volts (V)) and 502 is omitted from the method 500.

At 504 shown in FIG. 5, the BL 140 connected to the memory cell 100 is asserted to charge or discharge the FN 135, while the SL 160 is connected to Vss or 0V, to set the desired polarization state of the FE material of the capacitor insulator 226 in the memory cell 100 in order to set a desired logic state. For a WRITE operation, an electric field is applied across the FE material of the capacitor insulator 226 in order to polarize the FE material in a direction corresponding to the desired logic state. Such an electric field may be applied by changing the voltage on the BL and/or on the SL coupled to the memory cell 100 (while WL coupled to the memory cell 100 is asserted). In some embodiments, to program a logic state "1," WL=Vdd, BL=0V, and SL=0V, while to program a logic state "0," WL=0, BL=Vdd, and SL=0V or Vdd, the later may enable a stronger WRITE. More specifically, in order to ensure that the polarization of the FE material in the capacitor 120 is set to the desired state, an electric field of suitable magnitude and direction may be applied across the FE material of the capacitor insulator 226, which is done by applying voltage of sufficiently high magnitude and a predefined polarity at the BL 140 at 504, for a time period that is equal to or greater than a minimum transition duration (e.g., about 1 to 100 nanoseconds (ns)). The term "minimum transition duration" here generally refers to a suitable duration of time during which a voltage (e.g., due to the voltages on the BL and WL, possibly in combination with the charge on the FN 135) is applied to the FE material of the capacitor insulator 226 to cause the FE material to be polarized and to store a polarization charge according to the applied voltage. The minimum transition duration may be a predetermined value depending on the materials used in the FE material stack of the capacitor insulator 226 and their thicknesses. Some embodiments described herein may use the minimum transition duration of 100 ns, however, this parameter should not be understood to be limiting as the minimum transition duration could be designed to be substantially shorter or longer based upon application-specific requirements. In general, longer minimum transition times can enable lower voltage operation, higher read signals, longer FE retention.

At 506, if the WL 150 was switched on at 502 (i.e., if logic state "1" was written), the WL 150 may be switched off, i.e., de-asserted. In some embodiments of 506, the SL 160 may be switched off as well.

FIG. 6 is a flow diagram of an example method 600 for reading a memory cell having a FE capacitor being separate from a transistor gate, e.g., the memory cell 100. The method 600 may be preceded by the method 500, where, as a result of performing the method 500, the BL 140 connected to the memory cell 100 may be pre-charged to Vdd to set the FE capacitor 120 to the desired logic state represented by the polarization state set in the FE material of the capacitor insulator 226.

The method 600 may begin with 602, where the WL 150 connected to the memory cell 100 is asserted (e.g., the WL 150 transitions from logic low to logic high to turn on the transistor 110), e.g., by applying voltage sufficient to turn on the transistor 110, e.g., 1.0 Volts (V). Once the transistor 110 is switched on, current can flow through it, between the first S/D region 214-1 and the second S/D region 214-2. Because the FE capacitor 120 is connected in series with the gate of the transistor 110, the current flowing between the first S/D region 214-1 and the second S/D region 214-2 is modulated (i.e., affected/changed) by the polarization state of the FE material of the capacitor insulator 226 in the FE capacitor 120. As described above, the first S/D region 214-1 of the transistor 110 is coupled to the BL 140, and the second S/D region 214-2 of the transistor 110 is coupled to the SL 160. At 604 shown in FIG. 6, a sense amplifier coupled to the BL 140 senses the current or voltage on the BL 140 to determine change in current/voltage as a result of the polarization state of the FE capacitor 120 affecting the drain current of the transistor 110 (e.g., if the BL 140 discharges, the bit was "1," if it does not discharge, then the bit can be assumed to be "0").

Referring, again, to the example memory array 300 shown in FIG. 3, during a READ operation of a given memory cell, e.g., according to the method shown in FIG. 6, for unselected words in the array, the WL remains de-asserted (e.g., the WL remains or is transitioned from logic HIGH to logic LOW, e.g., 0V) and the transistors of the array having gate terminals coupled to such WL remain turned off. This will enable clear sensing of the selected memory cell by reducing the current through the unselected memory cells which may be connected to the same BL. For example, during the READ of the memory cell 100-11 shown in FIG. 3, WL1 is asserted so that the transistor 110 of the memory cell 100-11 turns on and a sense amplifier senses current or voltage on the BL1 to determine the logic state of the memory cell 100-11. The memory cell 100-12 is connected to the same bit-line BL1 and, therefore, could, in principle, affect the current or voltage on BL1. However, because WL2 is de-asserted when WL1 is asserted to READ the memory cell 100-11, the transistor of the memory cell 100-12 is off and there is no current flowing through the transistor 110 of the memory cell 100-12 and affecting the reading of the memory cell 100-11. As a result of asserting WL1, the transistor 110 of the memory cell 100-21 also turns on, but since reading of the memory cell 100-11 is performed with a sense amplifier senses current or voltage on the BL1, change in voltage/current on BL2 has no effect on reading the logic state of the memory cell 100-11.

Figure 7:
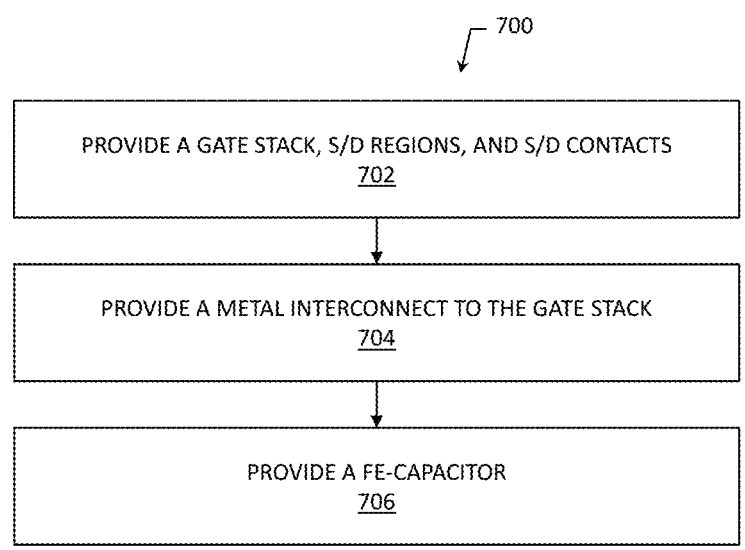
FIG. 7 is a flow diagram of an example method for fabricating a memory cell having a FE capacitor being separate from a transistor gate, in accordance with various embodiments of the present disclosure.

Fabricating a Memory Cell with a FE Capacitor Being Separate from a Transistor Gate Various embodiments of the memory cells 100 disclosed herein may be manufactured using any suitable techniques. For example, FIG. 7 is a flow diagram of an example method 700 of manufacturing a memory cell with a FE capacitor being separate from a transistor gate, in accordance with various embodiments.

Although the operations of the method 700 are illustrated once each and in a particular order, the operations may be performed in any suitable order and repeated as desired. For example, one or more operations may be performed in parallel, e.g., to manufacture multiple memory cells substantially simultaneously, or/and to manufacture the transistors and the FE capacitors of the memory cells substantially simultaneously. In another example, the operations may be performed in a different order to reflect the structure of a memory device in which the memory cell will be included. In yet another example, some operations may be combined into a single operation, and some operations may be subdivided into more operations than what is shown in FIG. 7.

At 702, a transistor may be provided over a support structure, the transistor including a semiconductor channel material, S/D regions, S/D contacts, and a gate stack. The transistor provided at 702 may take any embodiments of the transistor 110, described herein, and may be manufactured using any known processes for fabricating transistors.

At 704, a metal interconnect may be provided, the metal interconnect electrically connected to the gate stack of the transistor provided at 702. The metal interconnect provided at 704 may take any embodiments of the metal interconnect 228, described herein, and may be manufactured using any known processes for fabricating metal interconnects.

At 706, a FE capacitor may be provided, the FE capacitor having one of its capacitor electrodes electrically connected to the metal interconnect provided at 704. The FE capacitor provided at 706 may take any embodiments of the FE capacitor 120, described herein. The order of 704 and 706 shown in FIG. 7 may be particularly useful if the FE capacitor 120 is implemented in the BEOL 220, i.e., where the metal interconnect 228 is provided first, and then the FE capacitor 120 is provided above the metal interconnect 228. In other embodiments, the order of 704 and 706 may be different. For example, if the FE capacitor 120 is provided in the FEOL (as described above for the further embodiments of the IC device 200), then the FE capacitor may be provided first, and then the metal interconnect 228 may be provided to couple the first capacitor electrode 222 of the FE capacitor 120 to the gate stack 210 of the transistor 110 provided at 702.

In some embodiments, the FE capacitor may be manufactured at 706 as follows. First, an opening may be formed (e.g., an opening in the insulating material 230, the insulating material 212, or the semiconductor material 204, depending on where the FE capacitor 120 is being placed). The opening may be formed using, e.g., any suitable etching techniques, possibly in combination with any suitable patterning technique such as photolithographic patterning, e-beam patterning, etc. Then the electrically conductive material of the first capacitor electrode 222 may be deposited to line sidewalls and a bottom of the opening. In some embodiments, the electrically conductive material of the first capacitor electrode 222 may be deposited using any suitable conformal deposition process, e.g., atomic layer deposition (ALD) or chemical vapor deposition (CVD), so that all exposed surfaces of the opening could be covered with the electrically conductive material of the first capacitor electrode 222. Next, the capacitor insulator 226 may be deposited into the opening lined with the electrically conductive material of the first capacitor electrode 222, e.g., using any suitable conformal deposition process, e.g., ALD or CVD. Finally, the electrically conductive material of the second capacitor electrode 224 may be deposited to at least partially fill the remaining space in the opening lined with the electrically conductive material of the first capacitor electrode 222 and with the capacitor insulator 226. In some embodiments, the electrically conductive material of the second capacitor electrode 224 may be deposited using any suitable deposition process (which may, but does not have to be a conformal deposition process), such as ALD, CVD, plasma-enhanced CVD (PECVD), or physical vapor deposition (PVD).

Although not specifically shown in FIG. 7, the method 700 may further include processes for coupling the memory cell 100 to READ and/or WRITE control lines. Such coupling may take the form of any of the embodiments of the transistor 110 and the FE capacitor 120 coupled to the WL, SL, and BL disclosed herein (e.g., any of the embodiments discussed herein with reference to the coupling as shown in the present drawings).

In various embodiments, the manufacturing method 700 may include other operations, not specifically shown in FIG. 7.

For example, in some embodiments, the IC device 200 or the memory cell 100 may be cleaned prior to or/and after any of the processes of the method 700 described herein, e.g., to remove surface-bound organic and metallic contaminants, as well as subsurface contamination, to promote adhesion, and/or to decrease interdiffusion of materials. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In some embodiments, cleaning may be carried out using chemical or plasma clean, or applying heat in a controlled environment.

In another example, the method 700 may include operations that include depositing sacrificial materials and providing openings in the sacrificial materials. A sacrificial material may include any material that has sufficient etch selectivity with respect to the surrounding materials so that, after the sacrificial material is deposited, a portion of the sacrificial material can be removed without substantially removing the surrounding materials. As known in the art, two materials are said to have "sufficient etch selectivity" when etchants used to etch one material do not substantially etch the other, enabling selective etching of one material but not the other. In some embodiments, a sacrificial material may be a sacrificial dielectric material. Some examples of such materials include silicon oxide (i.e., a compound comprising silicon and oxygen, e.g., $SiO2$), hafnium oxide (i.e., a compound comprising hafnium and oxygen e.g., $HfO2$), silicon nitride (i.e., a compound comprising silicon and nitrogen, e.g., SiN), silicon oxynitride (i.e., a compound comprising silicon, oxygen, and nitrogen, e.g., SiON), aluminum oxide (i.e., a compound comprising aluminum and oxygen, e.g., $Al_2O_3$), aluminum hafnium oxide (i.e., a compound comprising aluminum, hafnium, and oxygen, e.g., AlHfO), carbon-doped oxide (i.e., a compound comprising carbon and oxygen), organic polymers such as perfluorocyclobutane or polytetrafluoroethylene, FSG, and organosilicates such as silsesquioxane, siloxane, or organosilicate glass. Besides appropriate etching characteristics, some other considerations in selecting a suitable sacrificial material may include e.g., possibilities of smooth film formation, low shrinkage and outgassing, and good dielectric properties (such as low electrical leakage, suitable value of a dielectric constant, and thermal stability). Any suitable deposition techniques may be used to provide the sacrificial material, such as spin-coating, dip-coating, ALD, CVD, PECVD, and thermal oxidation.

In yet another example, the method 700 may include any suitable planarization/polishing techniques to remove excess or overburden of materials deposited in a given process. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of the desired material.

Example Devices and Components

Memory cells and arrays with FE capacitors separate from transistor gates as disclosed herein may be included in any suitable electronic device. FIGS. 8-14 illustrate various examples of devices and components that may include one or more memory cells having FE capacitors separate from transistor gate stacks as disclosed herein.

Figures 8A, 8B:
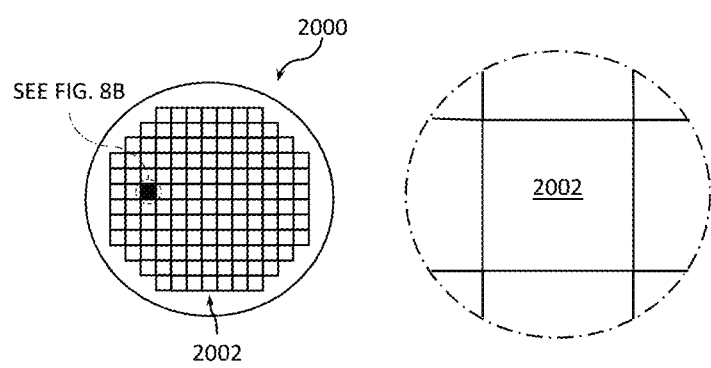
FIGS. 8A-8B are top views of a wafer and dies that may include one or more memory cells having FE capacitors separate from transistor gates in accordance with any of the embodiments disclosed herein.

FIGS. 8A-8B are top views of a wafer 2000 and dies 2002 that may include one or more memory cells having FE capacitors separate from transistor gates in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 10. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory cells having FE capacitors separate from transistor gates as described herein). After the fabrication of the semiconductor product is complete (e.g., after manufacture of one or more memory cells having FE capacitors separate from transistor gates as described herein), the wafer 2000 may undergo a singulation process in which each of the dies 2002 is separated from one another to provide discrete "chips" of the semiconductor product. In particular, devices that include one or more memory cells having FE capacitors separate from transistor gates as disclosed herein may take the form of the wafer 2000 (e.g., not singulated) or the form of the die 2002 (e.g., singulated). The die 2002 may include one or more transistors (e.g., one or more transistors 110 and/or one or more of conventional logic transistors, discussed below), one or more FE capacitors (e.g., one or more FE capacitors 120), and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. In some embodiments, the wafer 2000 or the die 2002 may include a memory device with a plurality of memory cells having FE capacitors separate from transistor gates, as described herein. Multiple ones of these devices may be combined on a single die 2002. For example, a memory array formed by multiple memory devices, e.g., formed by multiple memory cells having FE capacitors separate from transistor gates as described herein, may be formed on a same die 2002 as a processing device (e.g., the processing device 2402 of FIG. 12) or other logic that is configured to store information in the memory devices or execute instructions stored in the memory array.

Figure 9:
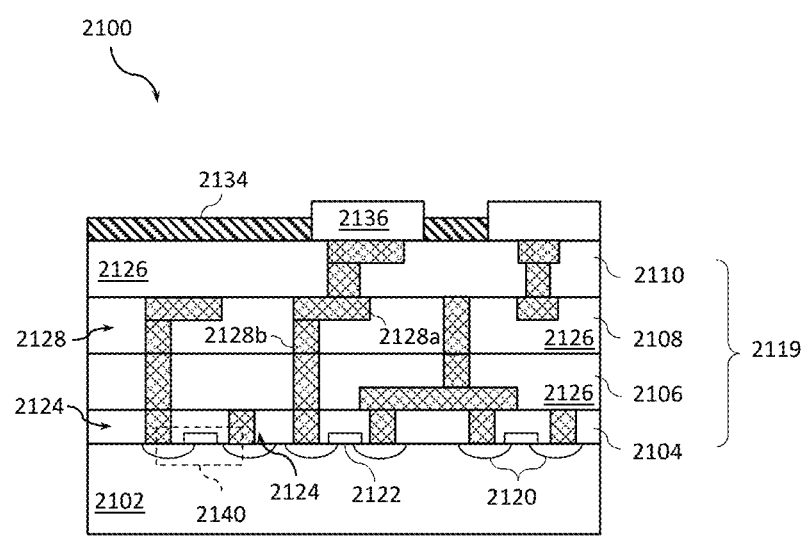
FIG. 9 is a cross-sectional side view of an IC device that may include one or more memory cells having FE capacitors separate from transistor gates in accordance with any of the embodiments disclosed herein.

FIG. 9 is a cross-sectional side view of an IC device 2100 that may include one or more memory cells having FE capacitors separate from transistor gates in accordance with any of the embodiments disclosed herein. In some embodiments, the IC device 2100 may serve as any of the dies 2256 in the IC package 2300 shown in FIG. 11.

As shown in FIG. 9, the IC device 2100 may be formed on a substrate 2102 (e.g., the wafer 2000 of FIG. 8A) and may be included in a die (e.g., the die 2002 of FIG. 8B). The substrate 2102 may include any material that may serve as a foundation/support structure for an IC device 2100. The substrate 2102 may be a semiconductor substrate, and may be implemented as any of the examples provided above with reference to the support structure 202 of the IC device 200. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 8B) or a wafer (e.g., the wafer 2000 of FIG. 8A).

The IC device 2100 may include one or more device layers 2104 disposed on the substrate 2102. The device layer 2104 may include features of one or more transistors 2140 (e.g., MOSFETs) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 that includes a gate electrode layer and, in some embodiments, may further include an optional gate dielectric layer. Generally, the gate dielectric layer of a transistor 2140 may include one layer or a stack of layers, and may include any of the materials described above with reference to the gate dielectric 322. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode material 206.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a finFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/ diffusion process or an etching/deposition process, for example any of the processes described with reference to the S/D regions 214.

Various transistors 2140 are not limited to the type and configuration depicted in FIG. 9 and may include a wide variety of other types and configurations such as, for example, planar transistors, non-planar transistors, or a combination of both. Any of the transistors 2140 may be implemented as, or replaced with, the transistors 110 of the memory cells 100, described herein.

Electrical signals, such as power and/or input/output (I/O) signals, may be routed to and/or from the transistors 2140 of the device layer 2104 through one or more interconnect layers disposed on the device layer 2104 (illustrated in FIG. 9 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 9). Although a particular number of interconnect layers 2106-1210 is depicted in FIG. 9, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 9. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 9. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 10:
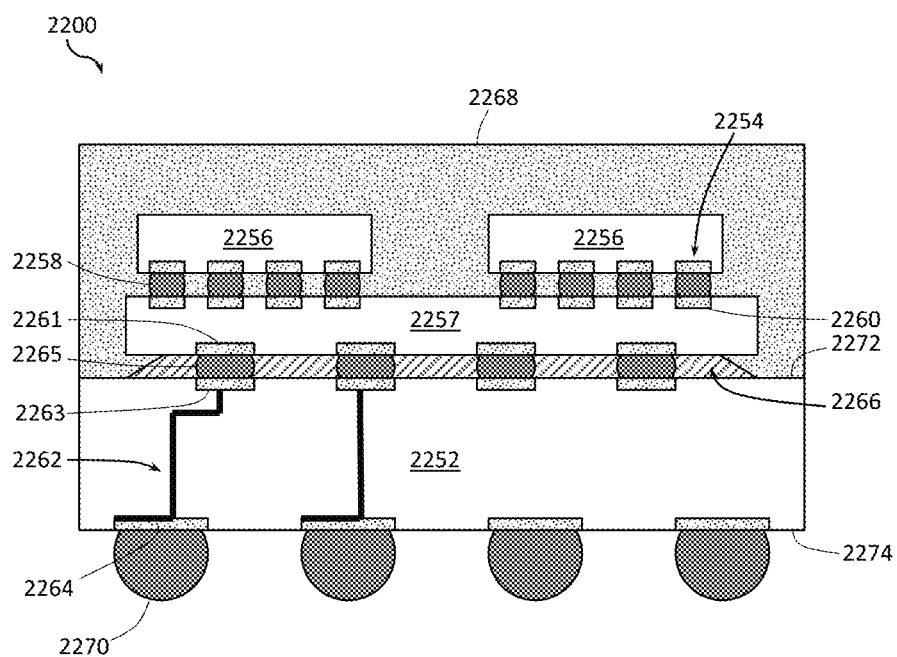
FIG. 10 is a cross-sectional side view of an IC package that may include one or more memory cells having FE capacitors separate from transistor gates in accordance with any of the embodiments disclosed herein.

FIG. 10 is a side, cross-sectional view of an example IC package 2200 that may include one or more memory cells having FE capacitors separate from transistor gates in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 9.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 10 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 10 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 10 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 11.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory, and/or dies implementing one or more memory cells having FE capacitors separate from transistor gates). In some embodiments, any of the dies 2256 may include one or more memory cells having FE capacitors separate from transistor gates, e.g., as discussed above with reference to FIG. 9; in some embodiments, at least some of the dies 2256 may not include any memory cells having FE capacitors separate from transistor gates.

The IC package 2200 illustrated in FIG. 10 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 10, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 11:
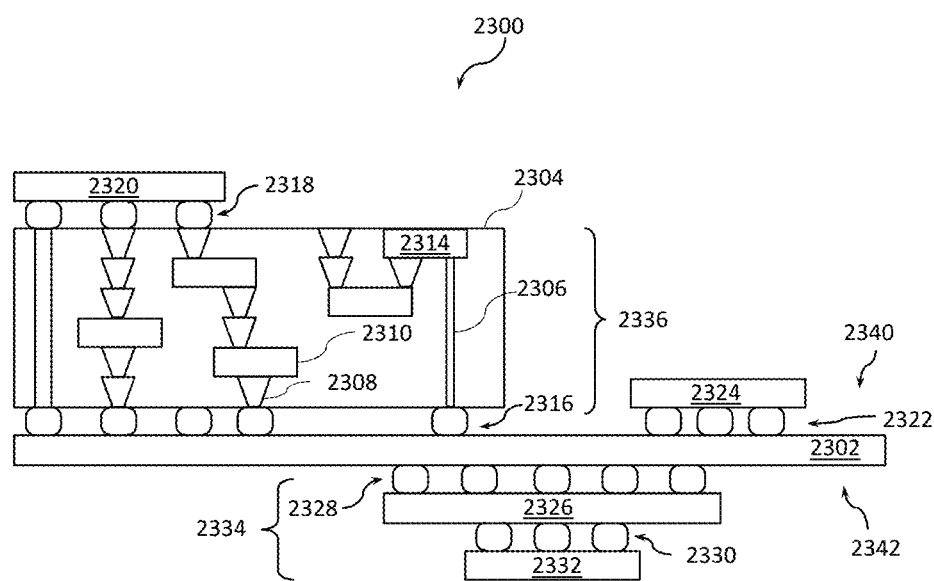
FIG. 11 is a cross-sectional side view of an IC device assembly that may include one or more memory cells having FE capacitors separate from transistor gates in accordance with any of the embodiments disclosed herein.

FIG. 11 is a cross-sectional side view of an IC device assembly 2300 that may include components having one or more memory cells having FE capacitors separate from transistor gates in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more memory cells having FE capacitors separate from transistor gates in accordance with any of the embodiments disclosed herein; e.g., any of the IC packages discussed below with reference to the IC device assembly 2300 may take the form of any of the embodiments of the IC package 2200 discussed above with reference to FIG. 10 (e.g., may include one or more memory cells having FE capacitors separate from transistor gates on/over/in a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 11 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 11), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8B), an IC device (e.g., the IC device 2100 of FIG. 9), or any other suitable component. In particular, the IC package 2320 may include one or more memory cells having FE capacitors separate from transistor gates as described herein. Although a single IC package 2320 is shown in FIG. 11, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 11, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. In particular, one or more thermal contacts as described herein may be thermally coupled to at least some of the embedded devices 2314. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art. In some embodiments, the interposer 2304 may include one or more thermal contacts as described herein.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 11 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 12:
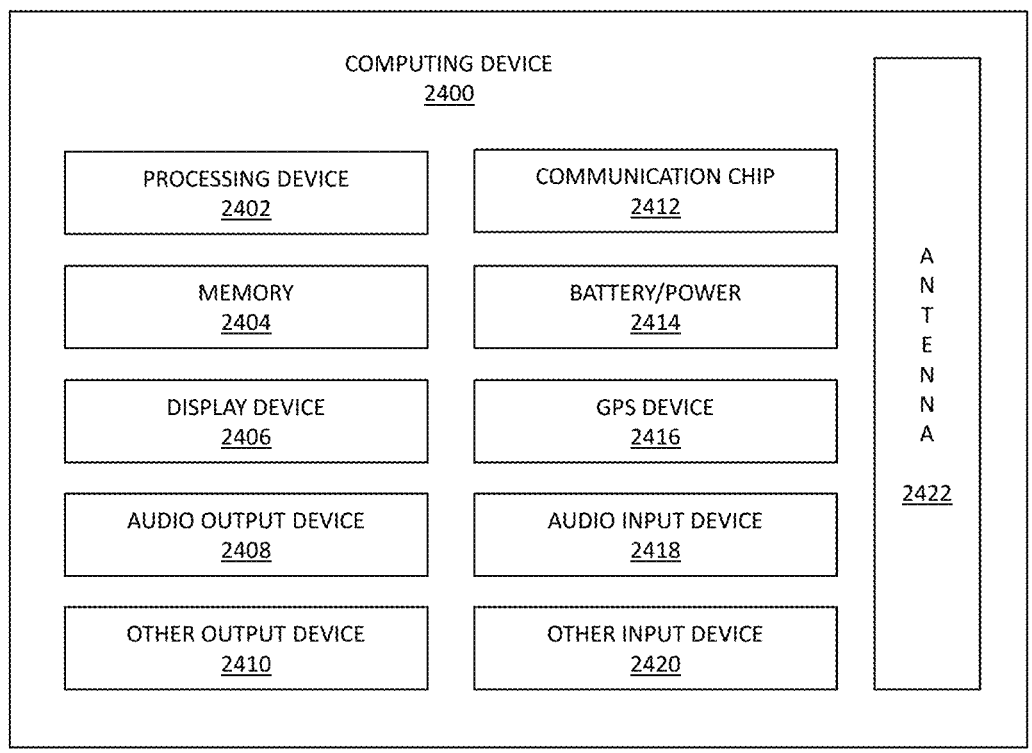
FIG. 12 is a block diagram of an example computing device that may include one or more components having memory cells having FE capacitors separate from transistor gates in accordance with any of the embodiments disclosed herein.

FIG. 12 is a block diagram of an example computing device 2400 that may include one or more components with one or more memory cells having FE capacitors separate from transistor gates in accordance with any of the embodiments disclosed herein. For example, any suitable ones of the components of the computing device 2400 may include a die (e.g., the die 2002 (FIG. 8B)) including one or more memory cells having FE capacitors separate from transistor gates in accordance with any of the embodiments disclosed herein. Any of the components of the computing device 2400 may include an IC device 2100 (FIG. 9) and/or an IC package 2200 (FIG. 10). Any of the components of the computing device 2400 may include an IC device assembly 2300 (FIG. 11).

A number of components are illustrated in FIG. 12 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 12, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-MRAM). In various embodiments, any one of the processing device 2402 and the memory 2404 may include one or more memory cells having FE capacitors separate from transistor gates as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a support structure (e.g., a substrate) and a transistor provided over the support structure, the transistor comprising a gate stack. The IC device also includes a FE capacitor, including a first capacitor electrode, a second capacitor electrode, and a capacitor insulator that includes a FE material between the first capacitor electrode and the second capacitor electrode, where the FE capacitor is separate from the gate stack (i.e., is not integrated within the gate stack and does not have any layers that are part of the gate stack) and an interconnect structure is configured to electrically couple the gate stack and the first capacitor electrode.

Example 2 provides the IC device according to example 1, where the IC device further includes a BEOL layer over the gate stack, the first capacitor electrode is a liner of a first electrically conductive material on sidewalls and a bottom of an opening in the BEOL layer, the capacitor insulator is a liner of the FE material on sidewalls and a bottom of the opening lined with the first electrically conductive material, the second capacitor electrode is a second electrically conductive material filling at least a portion of the opening lined with the first electrically conductive material and with the FE material, and the interconnect structure is in the BEOL layer.

Example 3 provides the IC device according to example 2, where a center axis of the opening in the BEOL layer is substantially aligned with a center axis of the gate stack.

Example 4 provides the IC device according to examples 2 or 3, where a center axis of the opening is substantially aligned with a center axis of the interconnect structure.

Example 5 provides the IC device according to example 4, where the interconnect structure is a via filled or lined with one or more electrically conductive materials.

Example 6 provides the IC device according to any one of examples 2-5, where the transistor is a first transistor, and the IC device further includes a second transistor provided over the support structure, the second transistor including a gate stack, the BEOL is over the gate stack of the second transistor, the FE capacitor is a first capacitor, and the IC device further includes a second FE capacitor, the interconnect structure is a first interconnect structure, and the IC device further includes a second interconnect structure, configured to electrically connect the gate stack of the second transistor and a first capacitor electrode of the second capacitor.

Example 7 provides the IC device according to example 6, where a source or drain (S/D) terminal of the first transistor is coupled to a S/D terminal of the second transistor.

Example 8 provides the IC device according to any one of the preceding examples, where the gate stack includes a gate electrode material, and the interconnect structure is configured to electrically connect the gate electrode material and the first capacitor electrode.

Example 9 provides the IC device according to any one of the preceding examples, where the second capacitor electrode of the FE capacitor is coupled to a WL.

Example 10 provides the IC device according to any one of the preceding examples, where the transistor includes a first source/drain (S/D) terminal coupled to a BL, and a second S/D terminal coupled to a SL. In some examples, the first S/D terminal (i.e., the terminal coupled to the BL) is a source terminal, while the second S/D terminal (i.e., the terminal coupled to the SL) is a drain terminal.

Example 11 provides the IC device according to any one of the preceding examples, where the transistor includes a semiconductor material shaped as a fin extending away from a base (i.e., the transistor is a fin-FET).

Example 12 provides the IC device according to any one of the preceding examples, where the FE material includes one or more of a material including hafnium, zirconium, and oxygen (e.g., hafnium zirconium oxide), a material including silicon, hafnium, and oxygen (e.g., silicon-doped hafnium oxide), a material including germanium, hafnium, and oxygen (e.g., germanium-doped hafnium oxide), a material including aluminum, hafnium, and oxygen (e.g., aluminum-doped hafnium oxide), a material including yttrium, hafnium, and oxygen (e.g., yttrium-doped hafnium oxide), and a perovskite material (e.g., lead zirconate titanate (PZT), PbTiO3 (PTO), or barium titanate (BTO)).

Example 13 provides the IC device according to any one of the preceding examples, where the FE material is a thin-film FE material.

Example 14 provides an IC package that includes an IC die; and a further IC component, coupled to the IC die. The IC die includes a FET provided over the IC die, the transistor including a gate stack, a BEOL layer, a ferroelectric (FE) capacitor, including a first capacitor electrode, a second capacitor electrode, and a capacitor insulator between the first capacitor electrode and the second capacitor electrode, where the first capacitor electrode is a liner of a first electrically conductive material on sidewalls and a bottom of an opening in the BEOL layer, the capacitor insulator is a liner of a FE material on sidewalls and a bottom of the opening lined with the first electrically conductive material, and the second capacitor electrode is a second electrically conductive material filling at least a portion of the opening lined with the first electrically conductive material and with the FE material, and an interconnect structure in the BEOL layer, configured to electrically connect the gate stack and the first capacitor electrode, where the interconnect structure is between the gate stack and the FE capacitor.

Example 15 provides the IC package according to example 14, where the further component is one of a package substrate, a flexible substrate, or an interposer.

Example 16 provides the IC package according to examples 14 or 15, where the further component is coupled to the IC die via one or more first-level interconnects.

Example 17 provides the IC package according to example 16, where the one or more first-level interconnects include one or more solder bumps, solder posts, or bond wires.

Example 18 provides a method for fabricating an IC device, the method including providing a FET provided over a support structure (e.g., a substrate), the transistor including a gate stack; providing a BEOL layer over the gate stack; providing a ferroelectric (FE) capacitor, including a first capacitor electrode, a second capacitor electrode, and a capacitor insulator between the first capacitor electrode and the second capacitor electrode, where the first capacitor electrode is a liner of a first electrically conductive material on sidewalls and a bottom of an opening in the BEOL layer, the capacitor insulator is a liner of a FE material on sidewalls and a bottom of the opening lined with the first electrically conductive material, and the second capacitor electrode is a second electrically conductive material filling at least a portion of the opening lined with the first electrically conductive material and with the FE material; and providing an interconnect structure in the BEOL layer, configured to electrically connect the gate stack and the first capacitor electrode.

Example 19 provides the method according to example 18, where providing the interconnect structure includes forming a via opening in the BEOL layer, the via opening exposing a gate electrode material of the gate stack, and filling or lining the via opening with one or more electrically conductive materials.

Example 20 provides the method according to example 19, where providing the FE capacitor includes forming the opening in the BEOL layer, the opening exposing the one or more electrically conductive materials filling or lining the via opening, depositing the liner of the first electrically conductive material on the sidewalls and the bottom of the opening, depositing the liner of the FE material on the sidewalls and the bottom of the opening lined with the first electrically conductive material, and filling or lining the opening lined with the first electrically conductive material and with the FE material with the second electrically conductive material.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first transistor and a second transistor, each comprising a gate stack, a first region, and a second region, wherein one of the first region and the second region is a source region and another one of the first region and the second region is a drain region; and
a first ferroelectric (FE) capacitor and a second FE capacitor, each comprising a first capacitor electrode, a second capacitor electrode, and a capacitor insulator that includes a FE material between the first capacitor electrode and the second capacitor electrode,
wherein:
the first FE capacitor is separate from the gate stack of the first transistor and a first interconnect structure is to electrically couple the gate stack of the first transistor and the first capacitor electrode of the first FE capacitor,
the second FE capacitor is separate from the gate stack of the second transistor and a second interconnect structure is to electrically couple the gate stack of the second transistor and the first capacitor electrode of the second FE capacitor,
the second capacitor electrode of the first FE capacitor and the second capacitor electrode of the second FE capacitor are connected to a word-line,
the first region of the first transistor and the first region of the second transistor are connected to a select-line,
the second region of the first transistor is connected to a first bit-line, and
the second region of the second transistor is connected to a second bit-line.

2. The IC device according to claim 1, wherein:
the IC device further includes a back end of line (BEOL) layer over the gate stack of the first transistor,
the first capacitor electrode of the first FE capacitor is a liner of a first electrically conductive material on sidewalls and a bottom of an opening in the BEOL layer,
the capacitor insulator of the first FE capacitor is a liner of the FE material on sidewalls and a bottom of the opening lined with the first electrically conductive material,
the second capacitor electrode of the first FE capacitor is a second electrically conductive material filling at least a portion of the opening lined with the first electrically conductive material and with the FE material, and
the first interconnect structure is in the BEOL layer.

3. The IC device according to claim 2, wherein a center axis of the opening in the BEOL layer is substantially aligned with a center axis of the gate stack of the first transistor.

4. The IC device according to claim 2, wherein a center axis of the opening is substantially aligned with a center axis of the first interconnect structure.

5. The IC device according to claim 4, wherein the first interconnect structure is a via at least partially filled or lined with one or more electrically conductive materials.

6. The IC device according to claim 2, wherein:
the BEOL is over the gate stack of the second transistor.

7. The IC device according to claim 1, wherein the gate stack of the first transistor includes a gate electrode material, and the first interconnect structure is to electrically connect the gate electrode material and the first capacitor electrode of the first FE capacitor.

8. The IC device according to claim 1, wherein the first transistor includes a semiconductor material shaped as a fin extending away from a base.

9. The IC device according to claim 1, wherein the FE material includes one or more of:
a material including hafnium, zirconium, and oxygen,
a material including silicon, hafnium, and oxygen,
a material including germanium, hafnium, and oxygen,
a material including aluminum, hafnium, and oxygen,
a material including yttrium, hafnium, and oxygen, and
a perovskite material.

10. The IC device according to claim 1, wherein the FE material is a thin-film FE material.

11. An integrated circuit (IC) package, comprising:
an IC die; and
a further IC component, coupled to the IC die,
wherein the IC die includes:
a first transistor and a second transistor, each comprising a gate stack, a first region, and a second region, wherein one of the first region and the second region is a source region and another one of the first region and the second region is a drain region; and
a first ferroelectric (FE) capacitor and a second FE capacitor, each comprising a first capacitor electrode, a second capacitor electrode, and a capacitor insulator that includes a FE material between the first capacitor electrode and the second capacitor electrode,
wherein:
the first FE capacitor is separate from the gate stack of the first transistor and a first interconnect structure is to electrically couple the gate stack of the first transistor and the first capacitor electrode of the first FE capacitor,
the second FE capacitor is separate from the gate stack of the second transistor and a second interconnect structure is to electrically couple the gate stack of the second transistor and the first capacitor electrode of the second FE capacitor,
the second capacitor electrode of the first FE capacitor and the second capacitor electrode of the second FE capacitor are connected to a word-line,
the first region of the first transistor and the first region of the second transistor are connected to a select-line,
the second region of the first transistor is connected to a first bit-line, and
the second region of the second transistor is connected to a second bit line.

12. The IC package according to claim 11, wherein the further component is one of a package substrate, a flexible substrate, or an interposer.

13. The IC package according to claim 11, wherein the further component is coupled to the IC die via one or more first-level interconnects.

14. The IC package according to claim 13, wherein the one or more first-level interconnects include one or more solder bumps, solder posts, or bond wires.

15. An integrated circuit (IC) device, comprising:
a first transistor and a second transistor, each comprising a gate stack, a first region, and a second region, wherein one of the first region and the second region is a source region and another one of the first region and the second region is a drain region; and
a first ferroelectric (FE) capacitor and a second FE capacitor, each comprising a first capacitor electrode, a second capacitor electrode, and a capacitor insulator that includes a FE material between the first capacitor electrode and the second capacitor electrode,
wherein:
the first FE capacitor is separate from the gate stack of the first transistor and a first interconnect structure is to electrically couple the gate stack of the first transistor and the first capacitor electrode of the first FE capacitor, the second FE capacitor is separate from the gate stack of the second transistor and a second interconnect structure is to electrically couple the gate stack of the second transistor and the first capacitor electrode of the second FE capacitor, the second capacitor electrode of the first FE capacitor is connected to a first word-line, the second capacitor electrode of the second FE capacitor is connected to a second word-line, the first region of the first transistor is connected to a first select-line, the first region of the second transistor is connected to a second select-line, and the second region of the first transistor and the second region of the second transistor are connected to a bit-line.

16. The IC device according to claim 15, wherein:

the IC device further includes a back end of line (BEOL) layer over the gate stack of the first transistor, the first capacitor electrode of the first FE capacitor is a liner of a first electrically conductive material on sidewalls and a bottom of an opening in the BEOL layer, the capacitor insulator of the first FE capacitor is a liner of the FE material on sidewalls and a bottom of the opening lined with the first electrically conductive material, the second capacitor electrode of the first FE capacitor is a second electrically conductive material filling at least a portion of the opening lined with the first electrically conductive material and with the FE material, and the first interconnect structure is in the BEOL layer.

17. The IC device according to claim 16, wherein a center axis of the opening in the BEOL layer is substantially aligned with a center axis of the gate stack of the first transistor.

18. The IC device according to claim 16, wherein a center axis of the opening is substantially aligned with a center axis of the first interconnect structure.

19. The IC device according to claim 15, wherein the first interconnect structure is a via at least partially filled or lined with one or more electrically conductive materials.

20. The IC device according to claim 15, wherein the first transistor includes a semiconductor material shaped as a fin extending away from a base.

* * * * *